(12) United States Patent
Schallner et al.

(10) Patent No.: US 6,657,508 B2
(45) Date of Patent: Dec. 2, 2003

(54) FREQUENCY-GENERATOR CIRCUIT

(75) Inventors: Martin Schallner, Ludwigsburg (DE); Jif Muller, Backnang (DE); Willibald Konrath, Weissach (DE)

(73) Assignee: Marconi Communications GmbH, Backnang (DE)

( * ) Notice: Subject to any disclaimer, the term of this patent is extended or adjusted under 35 U.S.C. 154(b) by 0 days.

(21) Appl. No.: 09/928,253

(22) Filed: Aug. 10, 2001

(65) Prior Publication Data
US 2002/0036547 A1 Mar. 28, 2002

(30) Foreign Application Priority Data
Aug. 16, 2000 (EP) .............................. 00117613

(51) Int. Cl.[7] ................................. H03B 1/00
(52) U.S. Cl. ................... 331/177 V; 331/117 R
(58) Field of Search ........................ 331/177 V, 117 R, 331/16, 34, 40, 48, 90; 333/235

(56) References Cited

U.S. PATENT DOCUMENTS

| | | | |
|---|---|---|---|
| 3,662,287 A | * 5/1972 | Egbert et al. | ............ 331/117 R |
| 4,380,831 A | 4/1983 | Hallford | |
| 4,636,757 A | * 1/1987 | Harrison et al. | .......... 333/21 R |
| 5,373,256 A | * 12/1994 | Nicotra et al. | .................. 331/2 |
| 5,428,838 A | 6/1995 | Chang et al. | |
| 5,819,169 A | 10/1998 | Fudem | |

FOREIGN PATENT DOCUMENTS

| | | |
|---|---|---|
| DE | 195 29 529 C1 | 10/1996 |
| FR | 2 325 240 | 4/1977 |

OTHER PUBLICATIONS

*Low–Loss, Planar Monolithic Baluns for K/KA–Band Applications*, James Schellenberg, et al., 1999 IEEE MTT–S Digest, pp. 1733–1736.

*Harmonic Dividers*, Chapter 9, Varactor Appl, Penfield & Rafuse, 1962, pp. 436–438.

* cited by examiner

Primary Examiner—Timothy P. Callahan
Assistant Examiner—Cassandra Cox
(74) Attorney, Agent, or Firm—Kirschstein, et al.

(57) ABSTRACT

A frequency-generator circuit employs the same circuit element (preferably a varactor) to perform the functions of parametric frequency-divider and frequency-adjustment element for an oscillator used to pump the parametric frequency-divider. The varactor preferably has a flat gamma-characteristic (gamma preferably >2) over a required bias-voltage adjustment range corresponding to the required frequency-adjustment range.

20 Claims, 3 Drawing Sheets

FREQUENCY-GENERATOR CIRCUIT

BACKGROUND OF THE INVENTION

The invention relates to a frequency-generator circuit containing a parametric frequency-divider.

Oscillators for use in phase-locked loops (PLLs) often require a frequency-divider section to reduce the input frequency to a value which can be handled by the phase detector. An example of a frequency-divider which operates on the parametric principle is disclosed in German patent DE 195 29 529 issued on Oct. 31, 1996 to Robert Bosch GmbH and is shown in FIG. 1. In FIG. 1 the central element is a varactor diode 10 which acts as a non-linear reactance. Upstream of the diode is an input filter 11, which is a high-pass filter tuned to the frequency of the input signal E and functions also as an impedance transformer matching the impedance of the line at the input of the circuit to the lower input impedance of the diode 10. Downstream of the diode is an output filter 12, which is a low-pass filter tuned to the divided-down frequency of the output signal A and also functions as an impedance transformer in the reverse sense to that of the input filter 11. A bias network for the diode 10 comprises an L-C circuit 13, via which a bias voltage $U_v$ is fed to the diode. A resistance R provides damping so that energy is not absorbed by the L-C network and no undesired oscillations are generated therein.

The varactor 10 possesses a capacitance-voltage characteristic given by the expression:

$$C = \frac{C_0}{\left(1 + \frac{U}{\phi}\right)^\gamma}$$

where U is the applied voltage, $C_0$ is the capacitance at U=0, $\Phi$ is the voltage on the inner diode contacts (ignoring the series loss-resistance) and $\gamma$ is an exponent governed by the physical characteristics of the individual diode. In order to ensure that the diode will operate in parametric mode without undue pump power being consumed, a diode is required having a high gamma ($\gamma$) over at least a part of its capacitance-voltage characteristic. FIG. 2 shows a typical gamma characteristic with variation in gamma plotted against applied voltage U. In this particular case the diode is biased so that it is operating in the region defined by the value $U_v$, i.e at the point at which gamma is maximum.

While this known circuit provides frequency-division at very low phase-noise, for example, it involves quite a lot of outlay considering it must also be used in conjunction with an oscillator having some form of additional frequency-adjusting facility.

SUMMARY OF THE INVENTION

In accordance with the present invention there is provided a frequency-generator circuit as recited in claim 1. Advantageous realisations of the circuit are set forth in the subclaims.

BRIEF DESCRIPTION OF THE DRAWINGS

Embodiments of the invention will now be described, by way of example only, with reference to the drawings, of which.

DETAILED DESCRIPTION OF THE EMBODIMENTS

Figure 3:
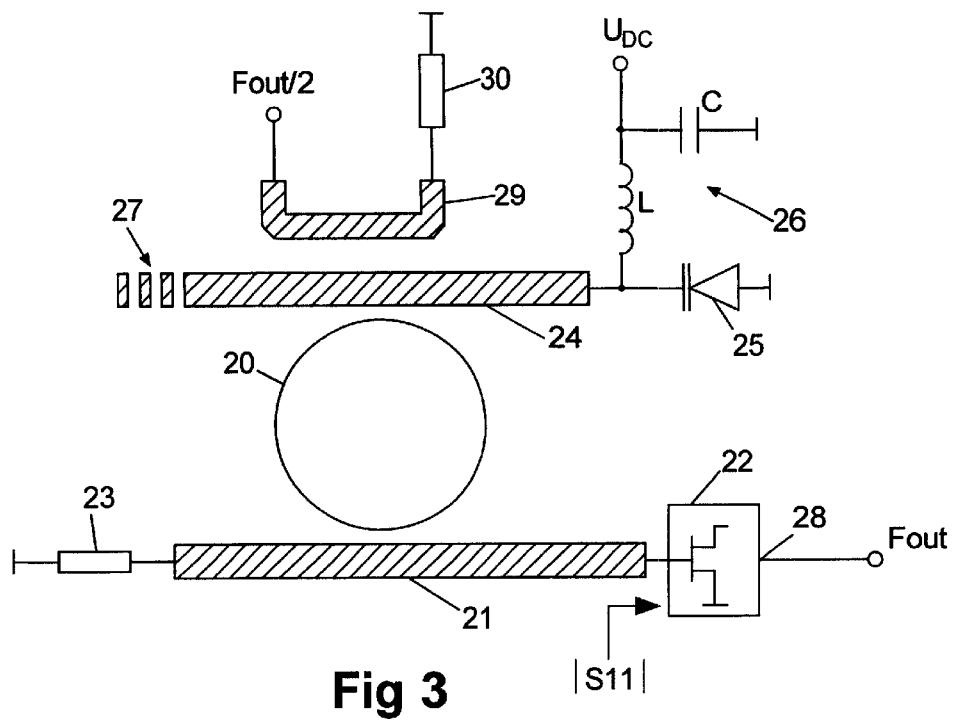
FIG. 3 illustrates a first embodiment of an oscillator circuit in accordance with the invention.

Referring to FIG. 3, a first embodiment of the invention is illustrated in which a dielectric resonator 20, consisting of a ceramic disk, has on one side a microstrip 21, which is coupled at one end of an oscillator devise 22, e.g. as illustrated a FET or a monolithic integrated oscillator circuit, and at the other end of ground via a matching impedance 23, while on the other side of the resonator 20 a second microstrip 24 is terminated at one end to ground by way of a varactor diode 25 and at the other end is unterminated, but is trimmable due to the presence of the trimming arrangement 27. This may comprise a series of narrow wirebondable line-sections, as shown, or a continuous section consisting of easily laser-trimmable thin-film sputtergold, in contrast to the much thicker galvanically produced gold of the rest of the line 24. A biasing voltage $U_{DC}$ is applied to the varactor by way of an L-C biasing network 26. The oscillator transistor 22 is operated in negative-resistance mode by virtue of the transistor having a positive reflection factor $|S11|>1$.

Figure 1:
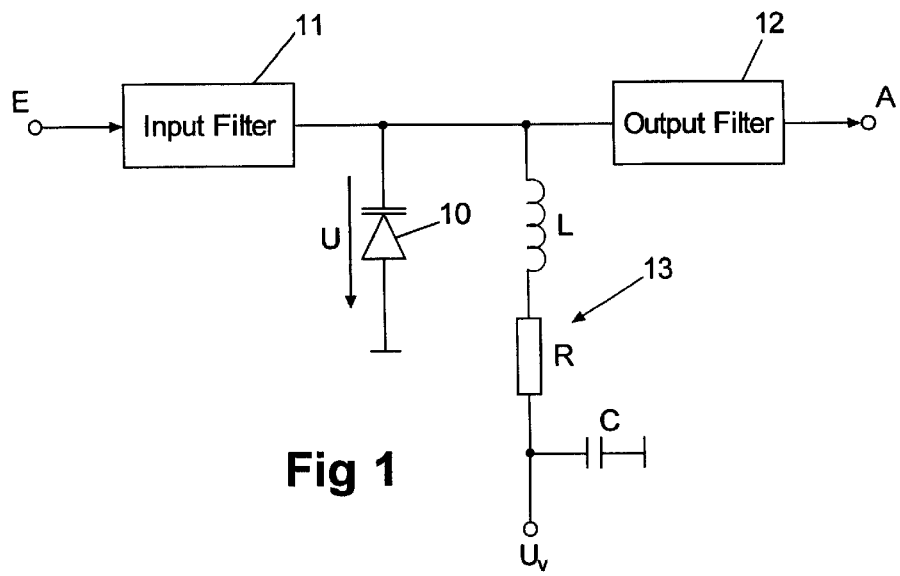
FIG. 1 is a circuit diagram of a prior-art frequency-divider arrangement.
Figure 2:
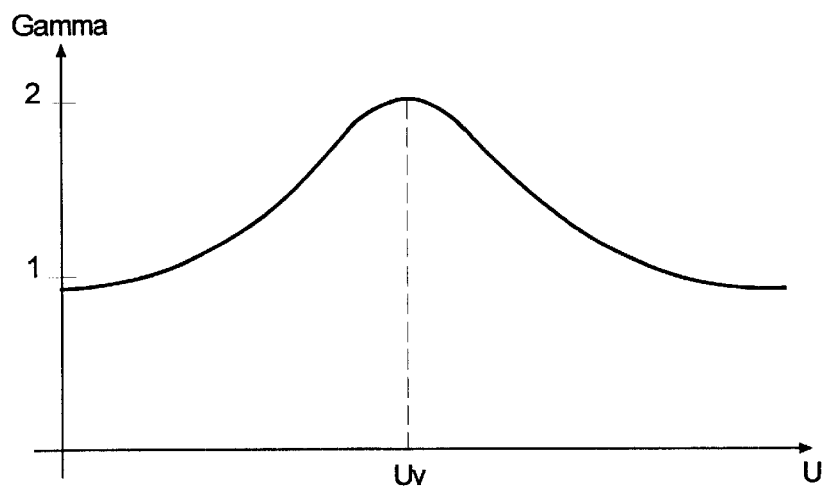
FIG. 2 is a graph showing the variation of gamma against voltage for a typical varactor diode.
Figure 4:
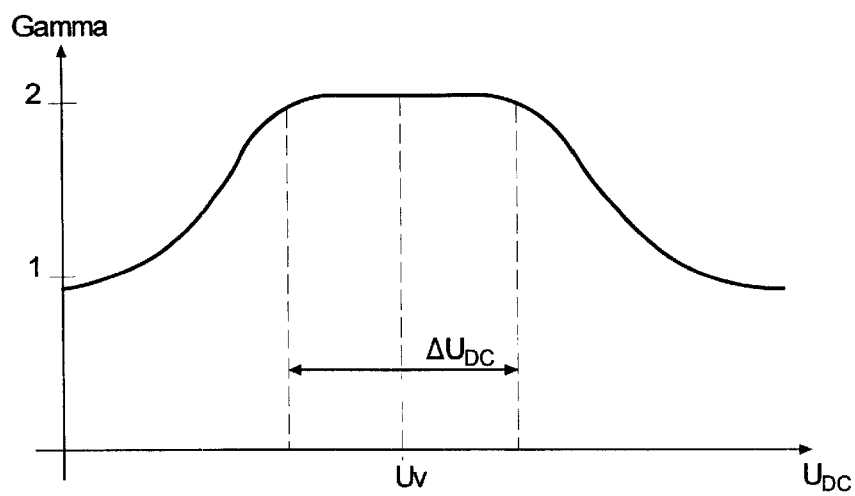
FIG. 4 is a graph of gamma versus bias-voltage for a varactor diode suitable for use in the present invention.

The varactor 25 functions in this circuit not only as a parametric frequency-divider, which requires that it be biased so as to operate at its maximum, or a suitably high, gamma value as in the case of FIG. 1, but also as a frequency-adjusting element for the oscillator arrangement 20, 21, 22. To this end the varactor should ideally have a substantially flat gamma-characteristic over its operating-voltage range in contrast to the noticeably peaked characteristic evident from FIG. 2. Such a preferred characteristic is shown in FIG. 4, in which can also be seen the range of bias-voltage variation, $\Delta U_{DC}$, which can be employed to vary the capacitance of the varactor and hence trim the operating frequency of the oscillator circuit. A wider range of bias-voltage variation could be tolerated, but this would then entail a lower mean value of gamma, which in turn would reduce pumping efficiency. Employing a diode having a constant gamma of >2 will provide a substantially linear frequency-adjusting effect and also result in low pumping power-drain on the oscillator arrangement.

The oscillator drives ("pumps") the diode 25 at a frequency F and this, due to the non-linear capacitance-voltage characteristic of the diode, gives rise to a negative resistance in the diode at the subharmonic divider frequency. When this negative resistance is greater than the positive loss-resistance of the diode, the diode oscillates at that subharmonic (division factor 2, 3, 4 . . . ), provided the microstrip 24 is suitably dimensioned. The length of the strip 24 determines both the slope of the varactor tuning characteristic and the division ratio and in respect of the latter the following relationship applies:

$$L_{total} = L_{min} + n\lambda/2$$

where $L_{total}$ is the total length of the strip, $L_{min}$ is the minimum length, $\lambda$ is wavelength at pump frequency, F and n is the division ratio. $L_{min}$ cannot be readily determined in an analytical way, since it is dependent on many, mainly parasitic, parameters such as the capacitance and gamma coefficient of the varactor diode, the type and thickness of the substrate, the width of the coupling line 24 and associated stray capacitances. Since there is no design formula as such, $L_{min}$ has to be determined by extensive simulation and in this case is made to satisfy a tradeoff between the obtaining of linear tuning at pump frequency, F, and the obtaining of a negative resistance at the divided frequency. The divided frequency (e.g. F/2) is available at an output 28 of the oscillator device 22, or of subsequent circuitry, along with the pump frequency F, though it is very strongly attenuated by the filtering action of the resonator 20 and perhaps also of the aforementioned subsequent circuitry, and is therefore weak. It can nevertheless still be taken from the output 28 and amplified. An alternative measure is to provide a coupling element 29 adjacent to the microstrip 24, one end of the coupling element being grounded via a matching impedance 30, the other acting as the F/2 output.

The parametric operation of the varactor relies on the provision of a sufficiently high pump-signal amplitude to drive the varactor. To achieve this, in a preferred form of the invention the oscillator element (e.g. FET) is operated as a high negative resistance, e.g. $|S11|=+10$ dB. This in turn allows a loose coupling of the resonator 20 to the strips 21 and 24, which increases the loaded resonator Q-factor, with the result that the higher energy stored in the resonator gives rise to a larger HF voltage amplitude at the varactor. In addition, because of the relatively weak coupling of the oscillator and resonator with the divider output 29, the varactor-diode resonance circuit comprising items 24, 25 and 27 is very well isolated from the rest of the circuit.

Figure 5:
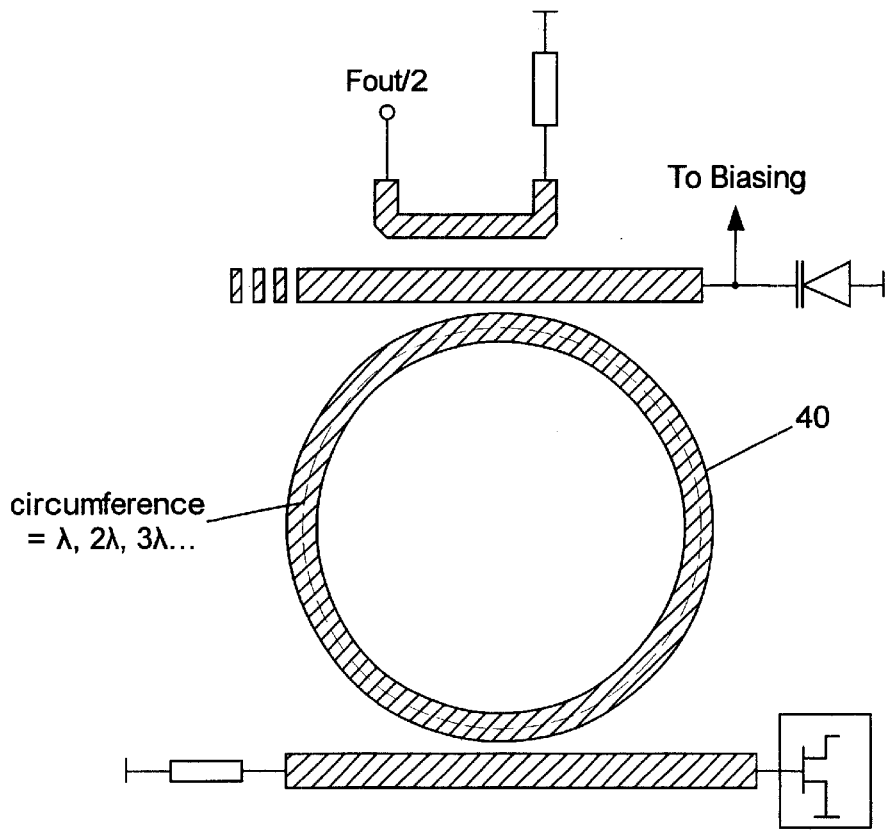
FIGS. 5, 6, 7 and 8 illustrate first, second, third and fourth realisations of a second embodiment of an oscillator circuit in accordance with the invention.

In a second embodiment of the invention, the dielectric resonator is replaced by a ring resonator (see FIG. 5). In the arrangement illustrated in FIG. 5 the only essential difference is the mechanism by which resonance is determined: in the case of the dielectric resonator it is the diameter and height above the circuit board of the dielectric disk which sets the resonance frequency, whereas in the ring-resonator case it is the diameter of the conductive ring 40 which is the governing factor.

Figure 6:
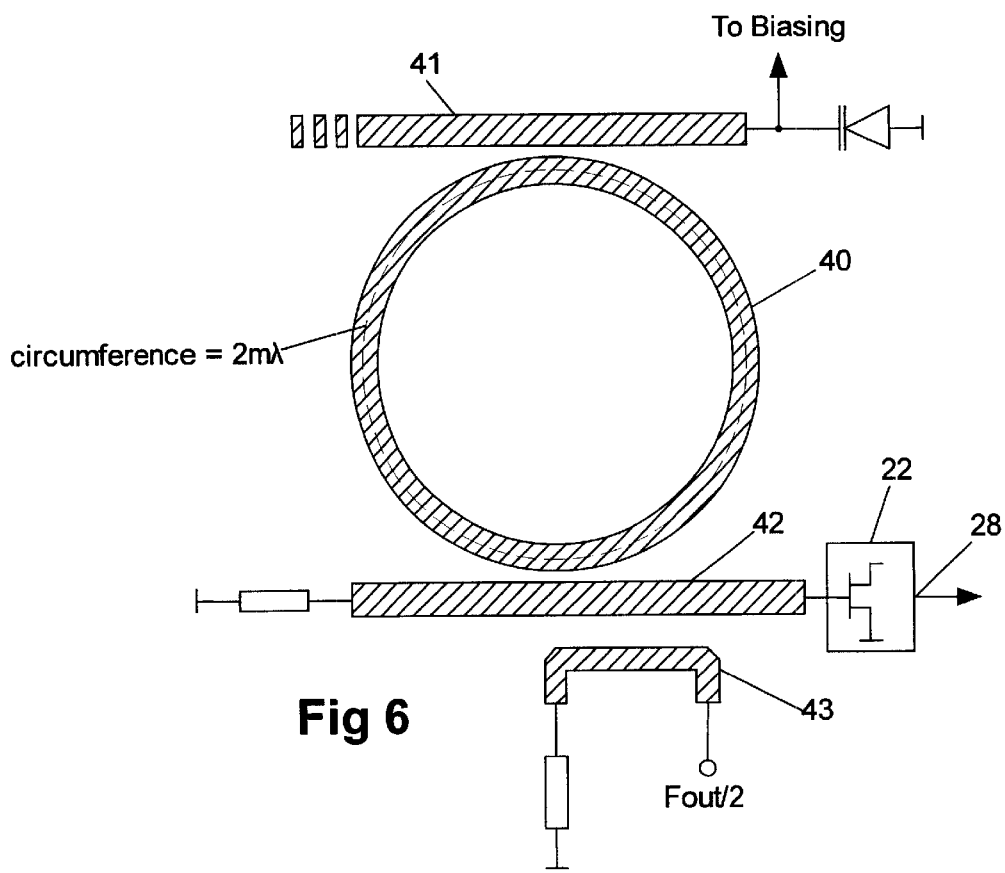
Figure 7:
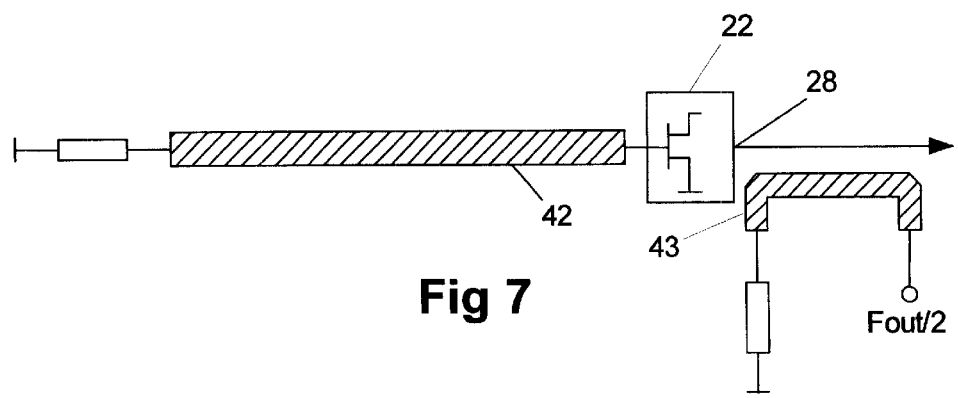
Figure 8:
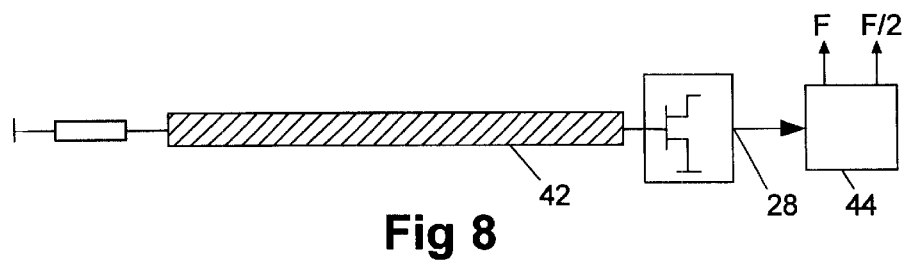

Three alternative realisations of the second embodiment are shown in FIGS. 6, 7 and 8 (in FIGS. 7 and 8 the resonator and varactor-related components are omitted for the sake of convenience). In all three cases the resonator circumference is designed to be, in wavelengths, an integer multiple m of the division factor n, i.e. for n=2 the diameter is 2 mλ. (In the FIG. 5 case it was assumed that the circumference was of length, λ, 2λ, 3λ, etc). The situation now is that, since the ring-resonator is in resonance not only at frequency F, but also at frequency F/2, the frequency-divided signal (at frequency F/2) couples from the varactor network via its coupling line 41 and the resonator 40 to the coupling line 42 of the active oscillator device 22. This oscillator device amplifies the frequency-divided signal as well as the pump frequency and both signals are available at the output 28. The coupling-out of the divider signal can take place as illustrated in FIG. 6, in which a coupling line 43, similar to the coupling line 29 of FIG. 3, is disposed adjacent, but in loose-coupling relationship, to line 42, or as illustrated in FIG. 7, in which the coupling line 43 couples to the output 28 of the FET (or similar) stage 22 (in this case coupler 43 advantageously couples out an amplified version of the divided frequency), or as shown in FIG. 8, in which the signal at the output 28 is taken to a diplexer 44, which separates out the signals. This latter arrangement results in fewer losses than the FIG. 6 or FIG. 7 arrangements, however all three arrangements have the advantage that the available extracted power is much higher than with the FIG. 3 or FIG. 5 schemes.

As well as the ability to provide integer frequency-division factors by the above-described techniques, it is also possible to generate odd non-integer division factors, e.g. 1.5, 3.5, etc). This can be achieved by mixing the integer-divided subharmonic divider frequency with the oscillator (pump) frequency.

What has been described is a frequency-generator with parametric frequency-divider and frequency-adjustment facility which is based on the use of only one device to perform both frequency-division and frequency-adjustment. Because of this and the lack of a need to include both input and output filters, the generator is more economical to produce than prior-art generators. It is also capable of providing frequency-division at very high frequencies (>20 GHz) so that it can be implemented in PLL-circuits operating at >30 GHz.

What is claimed is:

1. A frequency-generator circuit, comprising: an oscillator; a frequency-adjusting element associated with the oscillator; a parametric frequency-divider having a frequency-dividing element operative as a negative-resistance element, said oscillator being operational as a pump for the parametric frequency-divider, said frequency-adjusting element being operational also as said frequency-dividing element, said frequency-dividing element being a varactor diode; and a bias-means connected to the varactor diode for providing a bias-voltage therefor, the varactor diode having a gamma-value which is substantially constant over a predetermined range of said bias-voltage, the predetermined bias-voltage range corresponding to a predetermined range of frequency-adjustment.

2. The circuit as claimed in claim 1, wherein said gamma-value is at least equal to two.

3. The circuit as claimed in claim 1, comprising a resonance means for establishing a frequency of operation of the oscillator.

4. The circuit as claimed in claim 3, wherein the resonance means is a dielectric resonator.

5. The circuit as claimed in claim 3, wherein the resonance means is a ring-resonator.

6. The circuit as claimed in claim 3, wherein the oscillator provides a pump signal of an amplitude such that the frequency-dividing element becomes sufficiently negative-resistant to generate a parametric effect, while at the same time allowing a loose coupling between the resonance means and the oscillator and between the resonance means and the frequency-dividing element.

7. The circuit as claimed in claim 6, wherein the oscillator is a negative-resistance device.

8. The circuit as claimed in claim 7, wherein the negative-resistance device has a positive reflection factor of at least equal to 10 dB.

9. A frequency-generator circuit, comprising: an oscillator; a frequency-adjusting element associated with the oscillator; a parametric frequency-divider having a frequency-dividing element, said oscillator being operational as a pump for the parametric frequency-divider, and said frequency-adjusting element being operational also as said frequency-dividing element; and a resonance means for establishing a frequency of operation of the oscillator, the resonance means being a ring-resonator.

10. The circuit as claimed in claim 9, wherein the frequency-dividing element is operative as a negative-resistance element.

11. The circuit as claimed in claim 10, wherein the frequency-dividing element is a varactor diode.

12. The circuit as claimed in claim 11, comprising a bias-means connected to the varactor diode for providing a bias-voltage therefor, the varactor diode having a gamma-value which is substantially constant over a predetermined range of said bias-voltage, the predetermined bias-voltage range corresponding to a predetermined range of frequency-adjustment.

13. The circuit as claimed in claim 12, wherein said gamma-value is at least equal to two.

14. The circuit as claimed in claim 9, wherein the resonance means is a dielectric resonator.

15. The circuit as claimed in claim 9, wherein the oscillator provides a pump signal of an amplitude such that the frequency-dividing element becomes sufficiently negative-resistant to generate a parametric effect, while at the same time allowing a loose coupling between the resonance means and the oscillator and between the resonance means and the frequency-dividing element.

16. The circuit as claimed in claim 15, wherein the oscillator is a negative-resistance device.

17. The circuit as claimed in claim 16, wherein the negative-resistance device has a positive reflection factor of at least equal to 10 dB.

18. A frequency-generator circuit, comprising: an oscillator; a frequency-adjusting element associated with the oscillator; and a parametric frequency-divider having a frequency-dividing element, said oscillator being operational as a pump for the parametric frequency-divider, and said frequency-adjusting element being operational also as said frequency-dividing element; and a resonance means for establishing a frequency of operation of the oscillator, said oscillator providing a pump signal of an amplitude such that the frequency-dividing element becomes sufficiently negative-resistant to generate a parametric effect, while at the same time allowing a loose coupling between the resonance means and the oscillator and between the resonance means and the frequency-dividing element.

19. The circuit as claimed in claim 18, wherein the oscillator is a negative-resistance device.

20. The circuit as claimed in claim 19, wherein the negative-resistance device has a positive reflection factor of at least equal to 10 dB.

* * * * *